United States Patent
Kasedo

(10) Patent No.: US 12,136,451 B2
(45) Date of Patent: Nov. 5, 2024

(54) MEMORY SYSTEM AND REFRESH METHOD

(71) Applicant: Kioxia Corporation, Tokyo (JP)

(72) Inventor: Rei Kasedo, Yokohama Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 149 days.

(21) Appl. No.: 17/897,758

(22) Filed: Aug. 29, 2022

(65) Prior Publication Data

US 2023/0307031 A1    Sep. 28, 2023

(30) Foreign Application Priority Data

Mar. 23, 2022  (JP) ................. 2022-047597

(51) Int. Cl.
*G11C 11/40* (2006.01)
*G11C 11/406* (2006.01)
*G11C 11/4096* (2006.01)

(52) U.S. Cl.
CPC .. *G11C 11/40618* (2013.01); *G11C 11/40615* (2013.01); *G11C 11/4096* (2013.01)

(58) Field of Classification Search
CPC ........ G11C 11/40618; G11C 11/40615; G11C 11/4096; G11C 16/08; G11C 16/10; G11C 16/32; G11C 16/3418; G11C 16/0483
See application file for complete search history.

(56) References Cited

U.S. PATENT DOCUMENTS

| | | | |
|---|---|---|---|
| 9,269,451 B2 | 2/2016 | Ellis | |
| 9,312,025 B2 | 4/2016 | Sakuma | |
| 10,199,115 B2 | 2/2019 | Shin et al. | |
| 2004/0228165 A1* | 11/2004 | Kim | G11C 11/406 365/154 |
| 2011/0292533 A1* | 12/2011 | Nitta | G11B 27/36 |
| 2017/0068466 A1* | 3/2017 | Kiyooka | G11C 16/10 |
| 2019/0294539 A1* | 9/2019 | Matsudaira | G06F 3/0679 |

FOREIGN PATENT DOCUMENTS

| | | |
|---|---|---|
| JP | 2015-032247 A | 2/2015 |
| JP | 2019-522284 A | 8/2019 |

* cited by examiner

*Primary Examiner* — Mohammed A Bashar
(74) *Attorney, Agent, or Firm* — Foley & Lardner LLP

(57) ABSTRACT

A memory system includes a non-volatile memory provided with a plurality of physical blocks, and a controller configured to execute a refresh for the plurality of blocks of the non-volatile memory to rewrite data of a first plurality of blocks to a second plurality of blocks provided in the plurality of blocks. In a first time period from a previous writing to each block provided in the first plurality of blocks to completion of the refresh for each block, the controller is capable of dynamically controlling a time at which the refresh for each block is started.

19 Claims, 9 Drawing Sheets

MEMORY SYSTEM AND REFRESH METHOD

CROSS-REFERENCE TO RELATED APPLICATION(S)

This application is based upon and claims the benefit of priority from Japanese Patent Application No. 2022-047597, filed Mar. 23, 2022, the entire contents of which are incorporated herein by reference.

FIELD

Embodiments described herein relate generally to a memory system and a refresh method.

BACKGROUND

A memory system provided with a memory is known. The memory system executes a compaction to secure a new storage area in the memory. Further, the memory system executes a refresh to rewrite data stored in the memory. The refresh includes a refresh executed at any timing, and a forced refresh executed periodically. The forced refresh is required to complete a processing including the compaction within a cycle. As a result, the forced refresh is often executed at the same timing for the target data of other operation.

DETAILED DESCRIPTION

Embodiments provide a memory system and a refresh method capable of appropriately controlling an execution speed of refresh.

In general, according to at least one embodiment, a memory system includes a non-volatile memory provided with a plurality of physical blocks, and a controller configured to execute a refresh for the plurality of blocks of the non-volatile memory to rewrite data of a first plurality of blocks to a second plurality of blocks provided in the plurality of blocks. In a first time period from a previous writing to each block provided in the first plurality of blocks to completion of the refresh for each block, the controller dynamically controls a time at which the refresh for each block is started.

Hereinafter, descriptions will be made on a memory system and a refresh method according to embodiments in detail with reference to the drawings. The present disclosure is not limited to the embodiments.

Figure 1:
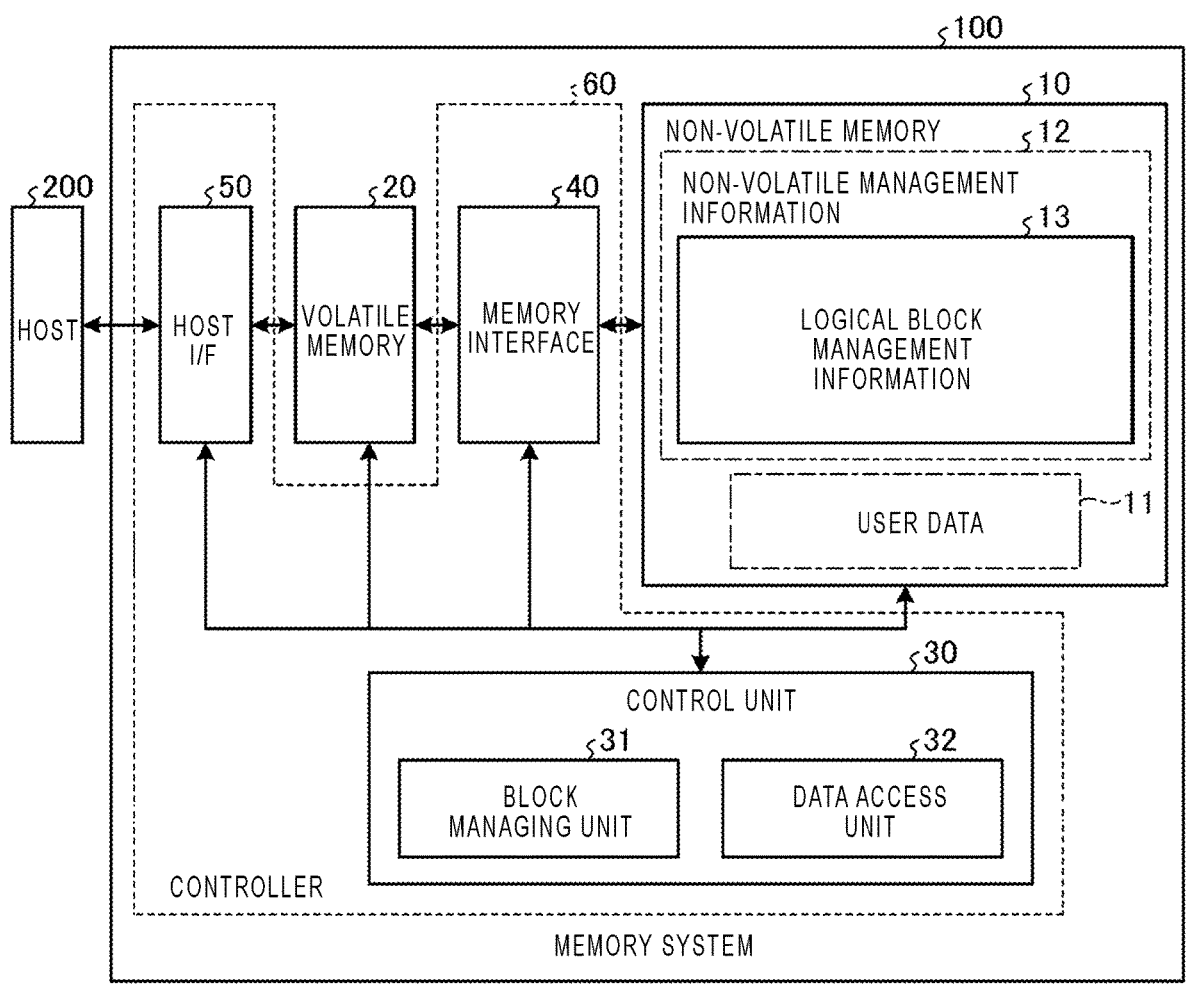
FIG. 1 is a block diagram illustrating an example of a schematic configuration of a memory system according to at least one embodiment.

FIG. 1 is a block diagram illustrating an example of a schematic configuration of a memory system according to an embodiment. A memory system 100 according to the embodiment includes a non-volatile memory 10. The memory system 100 writes data to the non-volatile memory 10, reads the data stored in the non-volatile memory 10, or erase the data stored in the non-volatile memory 10. The non-volatile memory 10 is provided with a plurality of physical blocks, each being the smallest unit of erasure.

The memory system 100 is, for example, a solid state drive (SSD). The memory system 100 may be connected to a host 200. The memory system 100 functions as an external storage device of the connected host 200. The host 200 is, for example, a CPU of a personal computer or a CPU of an imaging device such as a still camera or a video camera.

The memory system 100 includes the non-volatile memory 10, a volatile memory 20, and a controller 60.

The controller 60 is also called a memory controller. The controller 60 includes a control unit 30, a memory interface 40, and a host interface (host I/F) 50. The non-volatile memory 10 is, for example, a semiconductor memory that can store data non-volatilely, such as a NAND flash memory. The volatile memory 20 is a semiconductor memory that may be accessed at a higher speed than the non-volatile memory 10. The controller 60 is a circuit configured as, for example, a system on chip (SoC). The volatile memory 20 may be provided outside the controller 60, or may be built in the controller 60.

The non-volatile memory 10 stores user data 11 instructed by the host 200, or store information on an operation of the memory system 100 as non-volatile management information 12. The non-volatile memory 10 is provided with a memory cell array in which a plurality of memory cells are arranged in a matrix shape, and each memory cell may store multiple values. The non-volatile memory 10 may be provided with a plurality of memory chips, and each memory chip is configured to be provided with a plurality of physical blocks, each being a unit of data erasure. Further, in the non-volatile memory 10, writing of data and reading of data are executed for each physical page. The physical block is configured to be provided with a plurality of physical pages.

Figure 2:
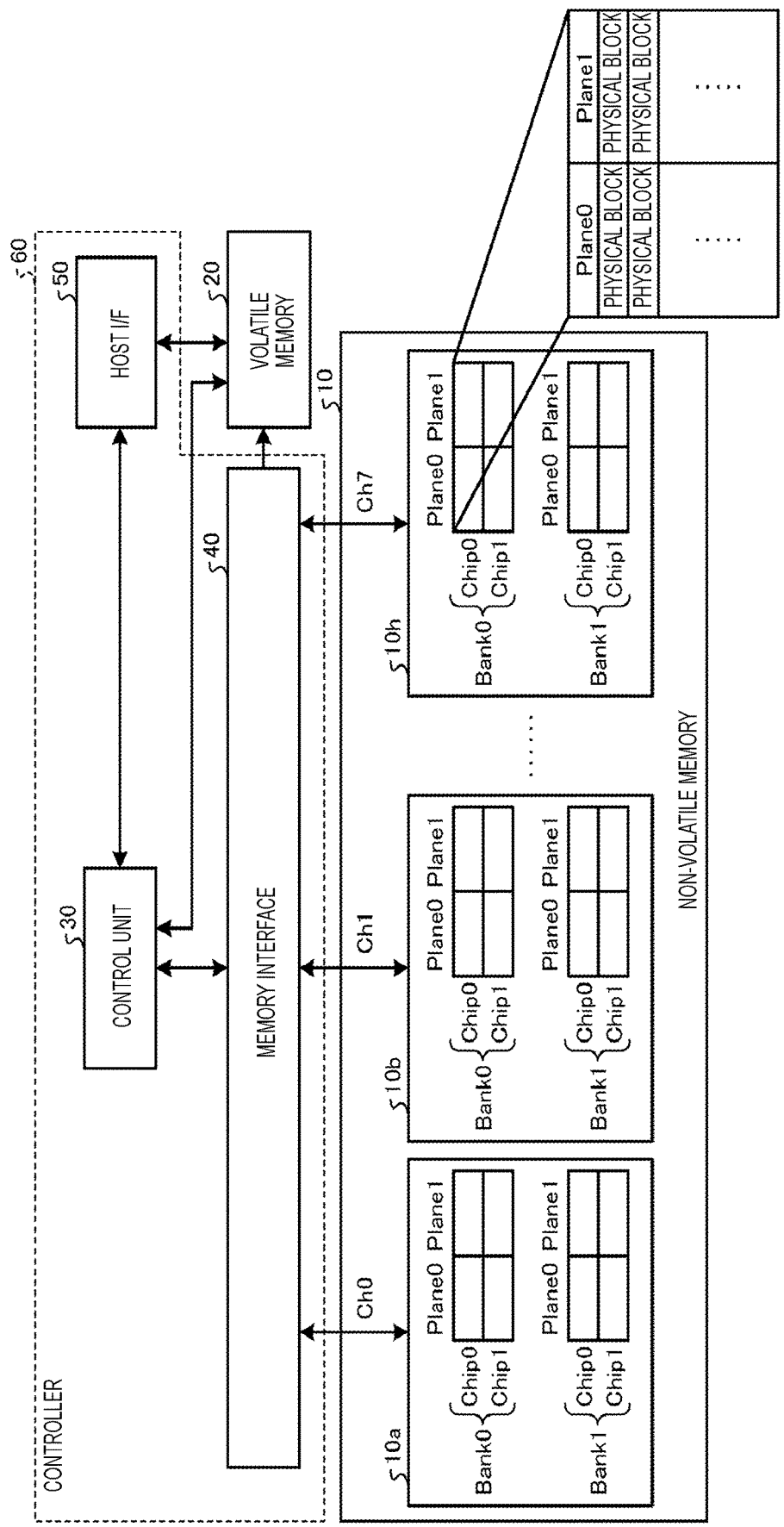
FIG. 2 is a diagram illustrating an example of a detailed configuration of a non-volatile memory according to at least one embodiment.

FIG. 2 is a diagram illustrating an example of a detailed configuration of the non-volatile memory 10. In this embodiment, the non-volatile memory 10 is connected in parallel to the memory interface 40 of the controller 60 via eight channels Ch0 to Ch7. That is, eight parallel operation elements 10a to 10h may be operated in parallel. The number of channels is not limited to eight, and any number of channels may be adopted. Each of the parallel operation elements 10a to 10h is configured with a plurality of banks (in this case, two banks of Bank 0 and Bank 1) capable of bank interleaving. In each of the parallel operation elements 10a to 10h, each bank is configured with a plurality of memory chips (in this case, two memory chips of Chip 0 and Chip 1). Each memory chip is divided into two areas (District) of Plane 0 and Plane 1, each of which is provided with a plurality of physical blocks. Plane 0 and Plane 1 are provided with peripheral circuits (e.g., row decoder, column decoder, page buffer, or data cache) independent from each other, and may erase/write/read in parallel by using a plane double speed mode.

In the non-volatile memory 10, a parallel operation by a plurality of channels, a parallel operation by a plurality of banks, and a parallel operation by a double speed mode using a plurality of planes are possible, and when the number of channels is eight, the number of banks is two, and the number of planes is two, it is possible to operate a maximum of 32 physical blocks in parallel. That is, the controller 60 may be connected to a plurality of physical blocks via a plurality of channels to operate the plurality of physical blocks in parallel.

The volatile memory 20 is provided with, for example, a storage area serving as a write buffer that, when data from the host 200 is written to the non-volatile memory 10, temporarily stores the data, a storage area that stores or updates management information such as the non-volatile management information 12, and a storage area serving as a read buffer that temporarily stores data read from the non-volatile memory 10. Further, the volatile memory 20 is provided with a working area for the operation of the controller 60.

The host 200 is connected to the memory system 100 via a host interface 50. The host 200 outputs a read request or a write request to the memory system 100. The read request and the write request include a logical block address (LBA) as a logical address. The LBA is a logical address in which a serial number from 0 is assigned to sectors. The size of the sector is, for example, 512 B.

In the memory system 100, the controller 60 constructs a virtual block referred to as a logical block, as a unit for collectively managing a plurality of physical blocks. The controller 60 constructs the logical block by combining the physical blocks capable of performing channel parallelization, bank interleaving, and the plane double speed operation. That is, the logical block is configured with the physical blocks corresponding to the number of channels×the number of banks×the number of planes. In a case in FIG. 2, the number of channels is eight, the number of planes is two, and the number of banks is two, and thus, the logical block may be configured with a maximum of 32 physical blocks.

When constructing the logical block, a media block address (MBA) is used as a logical address. This is the logical address specified in the memory system 100, and is distinguished from the LBA serving as the logical address specified by the host 200. The logical block may be configured with only the physical blocks corresponding to a plurality of channels, only the physical blocks corresponding to a plurality of banks, or only the physical blocks corresponding to a plurality of planes. Further, the physical blocks may be combined to perform the channel parallelization and the bank interleaving, to perform the channel parallelization and the plane double speed operation, or to perform the bank interleaving and the plane double speed operation.

The non-volatile management information 12 illustrated in FIG. 1 is information in which management information used in the memory system 100 is non-volatile. When the management information is generated or updated, the controller 60 stored the management information in the non-volatile memory 10 and makes it non-volatile. The non-volatile management information 12 includes a logical-to-physical address conversion table (not illustrated), logical block management information 13, or the like. The logical-to-physical address conversion table is information for managing correspondence between the LBA, which is the logical address specified by the host 200, and the physical address that indicates a storage position of data in the non-volatile memory 10. The logical block management information 13 is information for managing a plurality of logical blocks constructed in the memory system 100.

The memory interface 40 is a circuit that performs an interface processing with the volatile memory 20 and the non-volatile memory 10. Based on the control of the control unit 30, the memory interface 40 writes the data temporarily stored in the volatile memory 20 to the non-volatile memory 10, or reads the data stored in the non-volatile memory 10 and transfers it to the volatile memory 20. The memory interface 40 may be independently provided with a circuit configured to perform the interface processing with the volatile memory 20, and a circuit configured to perform the interface processing with the non-volatile memory 10.

The function of the control unit 30 is realized by a system program (firmware) stored in the non-volatile memory 10, and a processor that executes the firmware. A part of or the entire processing performed by the control unit 30 may be performed by dedicated hardware in the controller 60. The control unit 30 is provided with a data access unit 32 and a block managing unit 31. The data access unit 32 performs, for example, a writing processing to the non-volatile memory 10 via the write buffer of the volatile memory 20, a reading processing from the non-volatile memory 10, and management (e.g., forced refresh) of the data stored in the non-volatile memory 10.

The forced refresh is a processing for data retention in the memory cells of the non-volatile memory 10. The forced refresh is a processing in which all user data 11 stored in the logical blocks is rewritten (refreshed) to a new logical block at regular intervals. The forced refresh is executed in a logical block unit. In the forced refresh, a counter (time) is set for each unit to be executed (e.g., logical block or a predetermined amount of data), and the counter is reset according to the execution. The execution order of the forced refresh is the unique numerical order (address order) assigned to the physical block. This number is not changed as long as the memory system 100 is operating.

That is, the data access unit 32 executes refresh with respect to a plurality of physical blocks of the non-volatile memory 10 to rewrite data of a first plurality of blocks provided in the plurality of blocks to a second plurality of blocks provided in the plurality of blocks.

The forced refresh is required to complete a processing including the compaction within a cycle. As a result, the forced refresh that also executes compaction may be executed at the same timing for target data. The compaction is a processing in which valid data in the logical block is collected and rewritten to another logical block so as to generate a new free block. A free block is a logical block that does not include valid data.

The forced refresh is operated assuming Worst Case, which is a maximum value of the number of processes per freely divided time based on a unit time of the execution of the forced refresh. The number of processes in the Worst Case in the embodiment is assumed 12. However, when operating assuming the Worst Case, the actual reading and writing execution of the forced refresh is biased to the first half of the unit time.

In the forced refresh, the execution speed of the compaction included in the forced refresh according to the state of the memory system 100 may be set by dynamically setting the execution cycle. However, it is necessary for the execution of the compaction included in the forced refresh to consider the timing.

Additionally, the progress situation of the host I/O, which is the input/output of data to/from the host 200 may be affected by the forced refresh.

The block managing unit 31 performs a logical block construction processing at the first time of power-ON in the manufacturing stage of the memory system 100, and registers the construction result in the logical block management information 13. Here, the relationship between the physical block and the logical block will be described with reference to FIG. 3.

Figure 3:
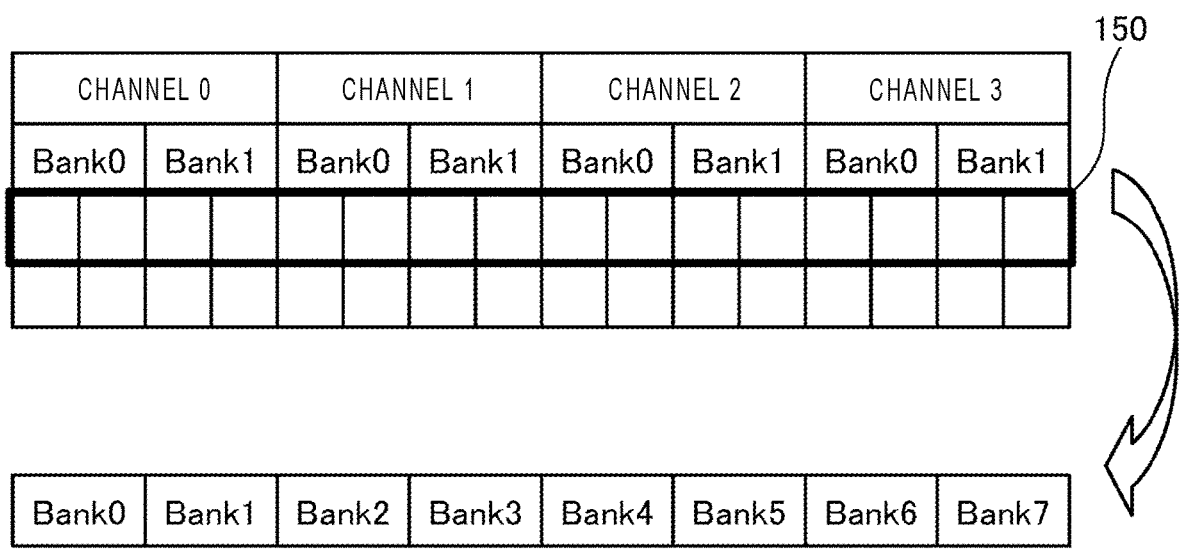
FIG. 3 is a diagram illustrating a relationship between a physical block and a logical block according to at least one embodiment.

FIG. 3 is a diagram illustrating a relationship between the physical block and the logical block. As illustrated in FIG. 3, when Bank 0 and Bank 1 exist in the channels 0 to 3, the block managing unit 31 constructs these Bank 0 and Bank 1 as one logical block 150. In this case, the block managing unit 31 sets the eight banks corresponding to the logical block 150 as Bank 0 to Bank 7. As described above, the block managing unit 31 constructs the logical block 150 provided with a plurality of banks.

It is necessary for the force refresh to execute at the timing according to the cycle as much as possible in order to prevent the execution cycle of the forced refresh from being accelerated.

Figure 4:
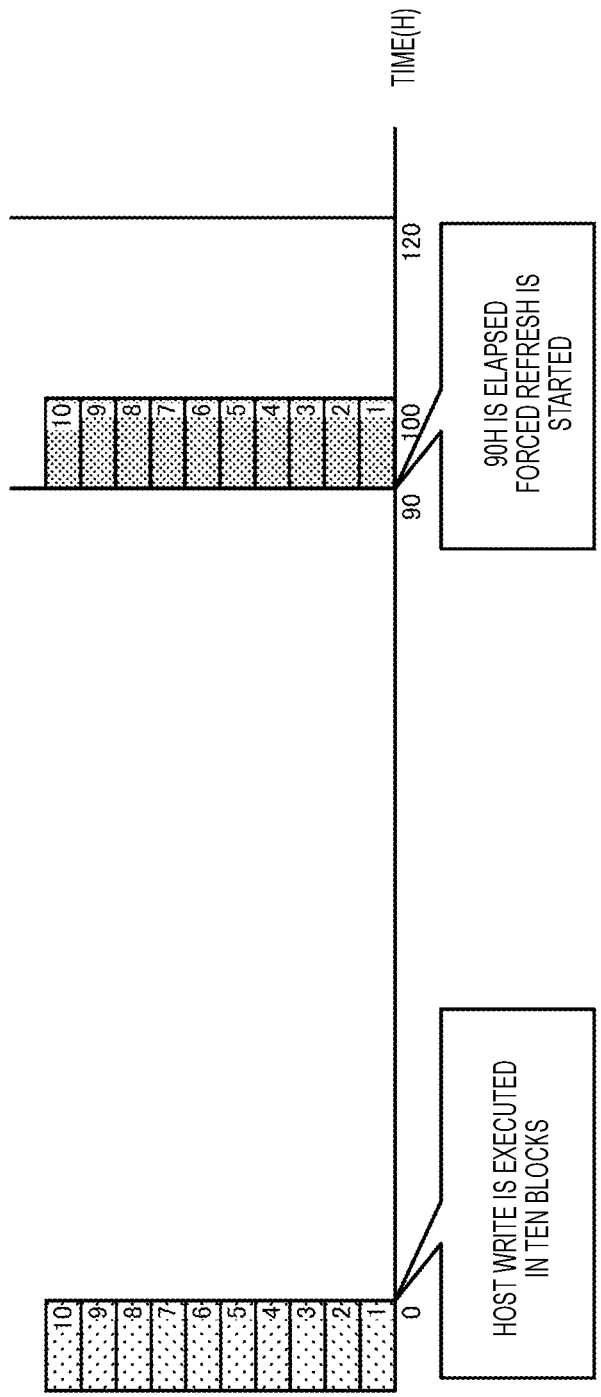
FIG. 4 is a diagram illustrating an example of a forced refresh processing in a comparative example.

Here, FIG. 4 is a diagram illustrating an example of a forced refresh processing in a comparative example. FIG. 4 illustrates an example in which the execution cycle of the forced refresh is set to 120 H (H: hour), and the unit time of the execution of the forced refresh of Worst Case is set to 30 H. In this case, the start of the forced refresh is set 90 H after the execution of Host Write, which is writing from the host 200. Further, in the example illustrated in FIG. 4, it is assumed that Host Write is executed for ten physical blocks (hereinafter, referred to as blocks). That is, in the example illustrated in FIG. 4, the forced refresh is not executed in the cycle of 120 H, but the forced refresh is started in the cycle of 90 H as a countermeasure for Worst Case. However, as illustrated in FIG. 4, after the forced refresh is started, the processing is completed in 10 H, there is a margin of 20 H with respect to the execution cycle of the forced refresh, and thus, the execution of the forced refresh may be postponed.

Therefore, in at least one embodiment, in order to alleviate the acceleration of the cycle of the forced refresh, the data access unit 32 performs a processing that postpones the execution of the forced refresh when the processing time of the forced refresh has a margin.

In other words, in a first time period from a previous writing to each block provided in the first plurality of blocks to completion of the forced refresh for each block, the data access unit 32 is capable of dynamically controlling the time at which the forced refresh for each block is started.

In the following, a procedure of the forced refresh processing that postpones the execution of the forced refresh will be described.

Figure 5:
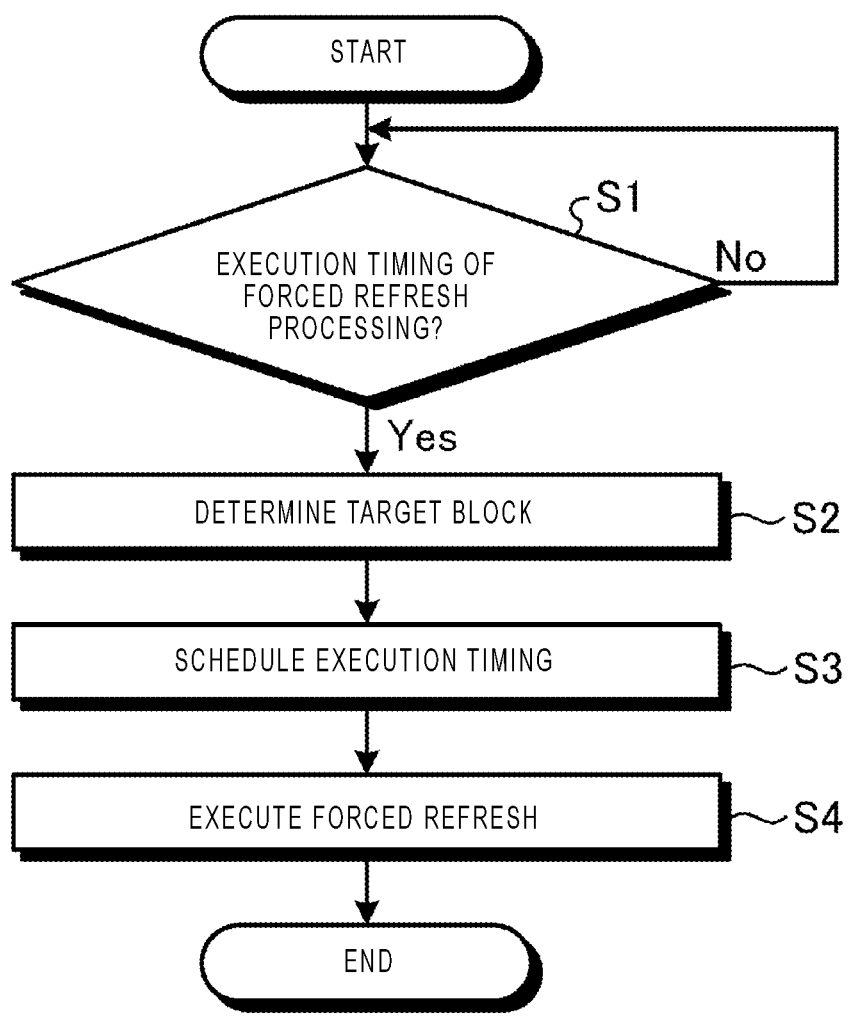
FIG. 5 is a flowchart illustrating a procedure of a forced refresh processing according to at least one embodiment.

FIG. 5 is a flowchart illustrating a procedure of the forced refresh processing according to at least one embodiment.

First, the data access unit 32 determines whether it is the execution timing of the forced refresh processing (S1). When it is determined that it is the execution timing of the forced refresh processing (Yes in S1), the data access unit 32 determines the block in which Host Write is executed in the unit time as a target block (S2).

Subsequently, the data access unit 32 schedules the execution timing of the forced refresh for the target block of the forced refresh (S3).

Subsequently, the data access unit 32 executes the forced refresh according to the schedule (S4).

In the following, the determination processing of the target block in S2 in FIG. 5 will be described.

Figure 6:
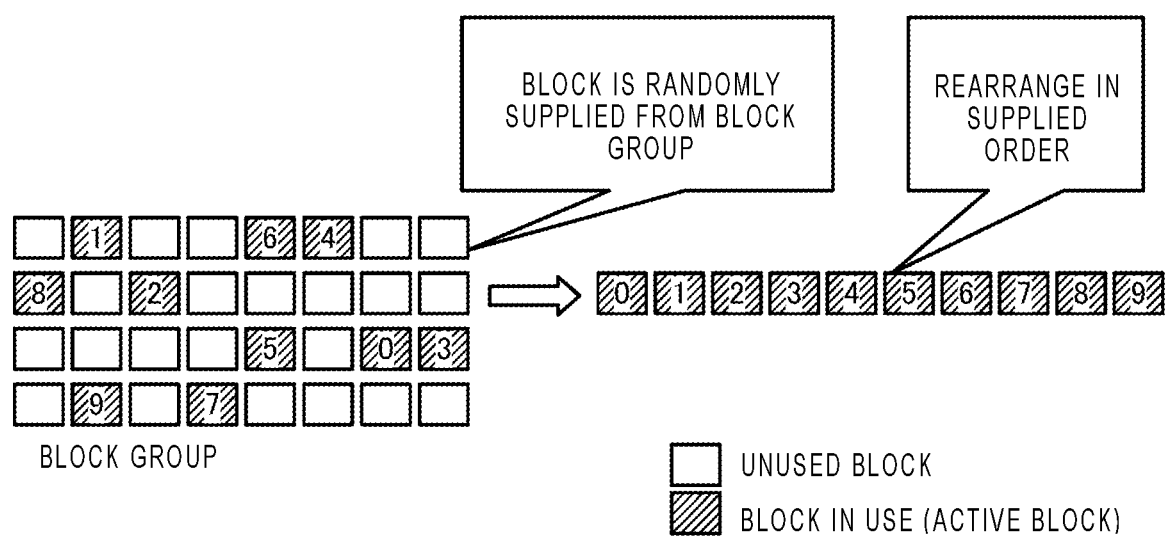
FIG. 6 is a diagram illustrating an example of creating a forced refresh list according to at least one embodiment.

Here, FIG. 6 is a diagram illustrating an example of creating a forced refresh list in the order of active blocks supplied as a storage location of the user data 11, which is a target of Host Write. As illustrated in FIG. 6, the data access unit 32 randomly selects an active block that is the storage location of the user data 11 from a block group, which is a set of active blocks and unused blocks. The data access unit 32 rearranges the selected active blocks in the selected order to create the forced refresh list.

As described above, the list is created in the order of the active blocks randomly selected as the storage location of the user data 11, which is the target of Host Write, and it has the following advantages. First, the number of blocks to be managed becomes a required minimum number. Second, by executing the forced refresh from the first block of the list, the execution order of the forced refresh is also random. For example, when the forced refresh is executed in a unique order, the forced refresh is executed in a faster cycle in only a specific block each time the forced refresh is executed. However, this phenomenon may be avoided by randomly selecting the active block. Third, the forced refresh is executed in the order of writing of the user data 11.

When a degree of wear-out of the block registered in the list is different from each other, the order may be changed in the list based on the degree of wear-out. For example, the order of the block that has a high degree of wear-out may be changed so that the forced refresh is executed earlier in that block.

In the following, the processes of S3 and S4 in FIG. 5 will be described.

Figure 7:
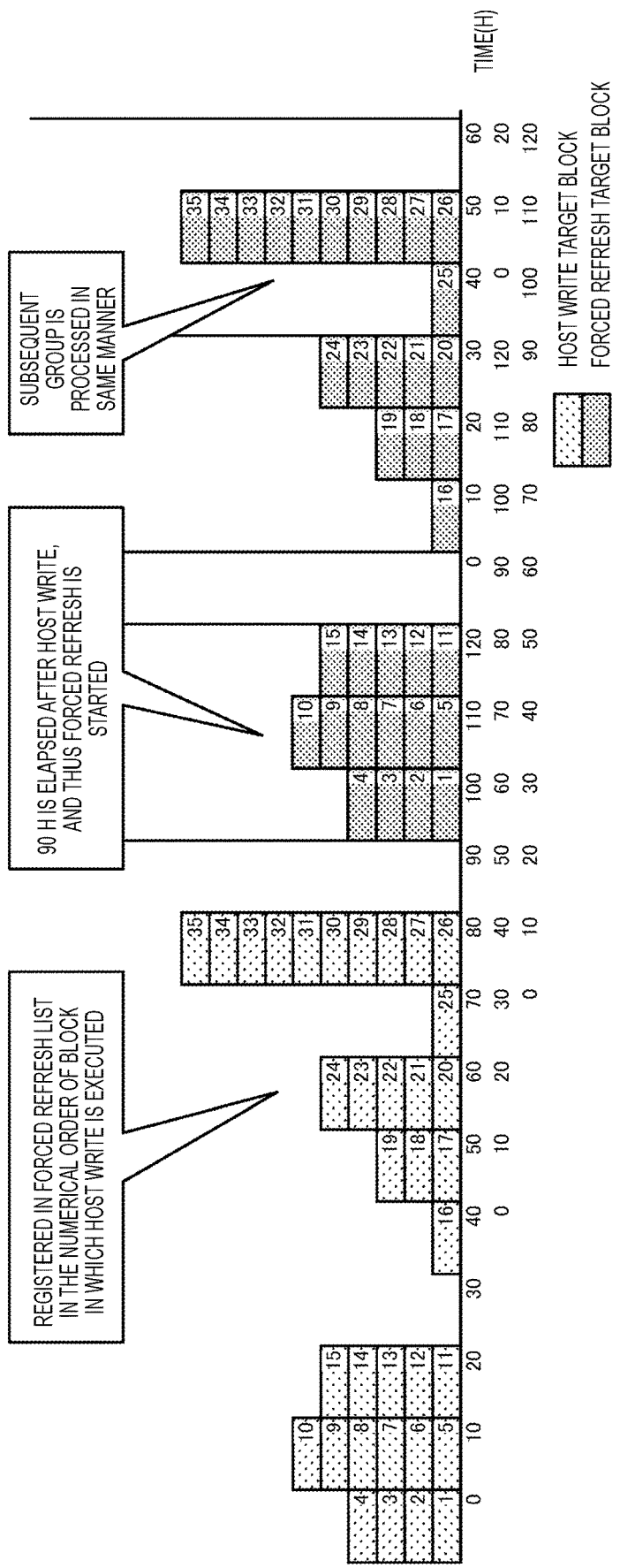
FIG. 7 is a diagram illustrating an example of a forced refresh processing in at least one embodiment.

FIG. 7 is a diagram illustrating an example of the forced refresh processing in at least one embodiment. FIG. 7 illustrates an example in which the execution cycle of the forced refresh is set to 120 H, and the unit time of the execution of the forced refresh of Worst Case is set to 30 H.

Specifically, the data access unit 32 uses an active block list, which is a list of the block in use, when the schedule of the forced refresh is executed. The active block is a block in use. The data access unit 32 creates a forced refresh list that indicates the execution order of the forced refresh, using the active block list, in the order of the active blocks supplied as the storage location of the user data 11. In FIG. 7, the block in which Host Write is executed is registered on the forced refresh list in the numerical order.

Further, the data access unit 32 derives the number of blocks in which the forced refresh is executed per freely divided time based on the unit time of the execution of the forced refresh of Worst Case. For example, the data access unit 32 derives the number of blocks per divided unit time assuming that the unit time of the execution of the forced refresh of Worst Case is 30 H, and the freely divided time is 10 H. A maximum value of the number of processes per freely divided time in the example illustrated in FIG. 7 is the same as the number of processes of Worst Case (12 in this embodiment), which is 12.

In this case, the block in which Host Write is executed is refreshed every unit time (30 H). That is, the data access unit 32 executes the forced refresh in the execution order of Host Write for each unit time (30 H). In the example illustrated in FIG. 7, the number of blocks in which Host Write is executed is 35, and the forced refresh is started after a lapse of a prescribed time (90 H). In this case, when 12 blocks are processed in a freely divided time (10 H) in the unit time (30 H), 36 blocks may be processed in the unit time (30 H), and thus, it is possible to correspond to Worst Case.

According to the example illustrated in FIG. 7, 15 blocks are forcibly refreshed in the first unit time (30 H). However, when the processing time of the forced refresh has a margin, the execution of the forced refresh may be postponed.

On the horizontal axis in FIG. 7, there are three start positions 0 (three time axes), which indicate the execution cycle (120 H) of the forced refresh in the execution order of Host Write for each unit time (30 H). The same applies to FIGS. 8 and 9 (both to be described later).

Figure 8:
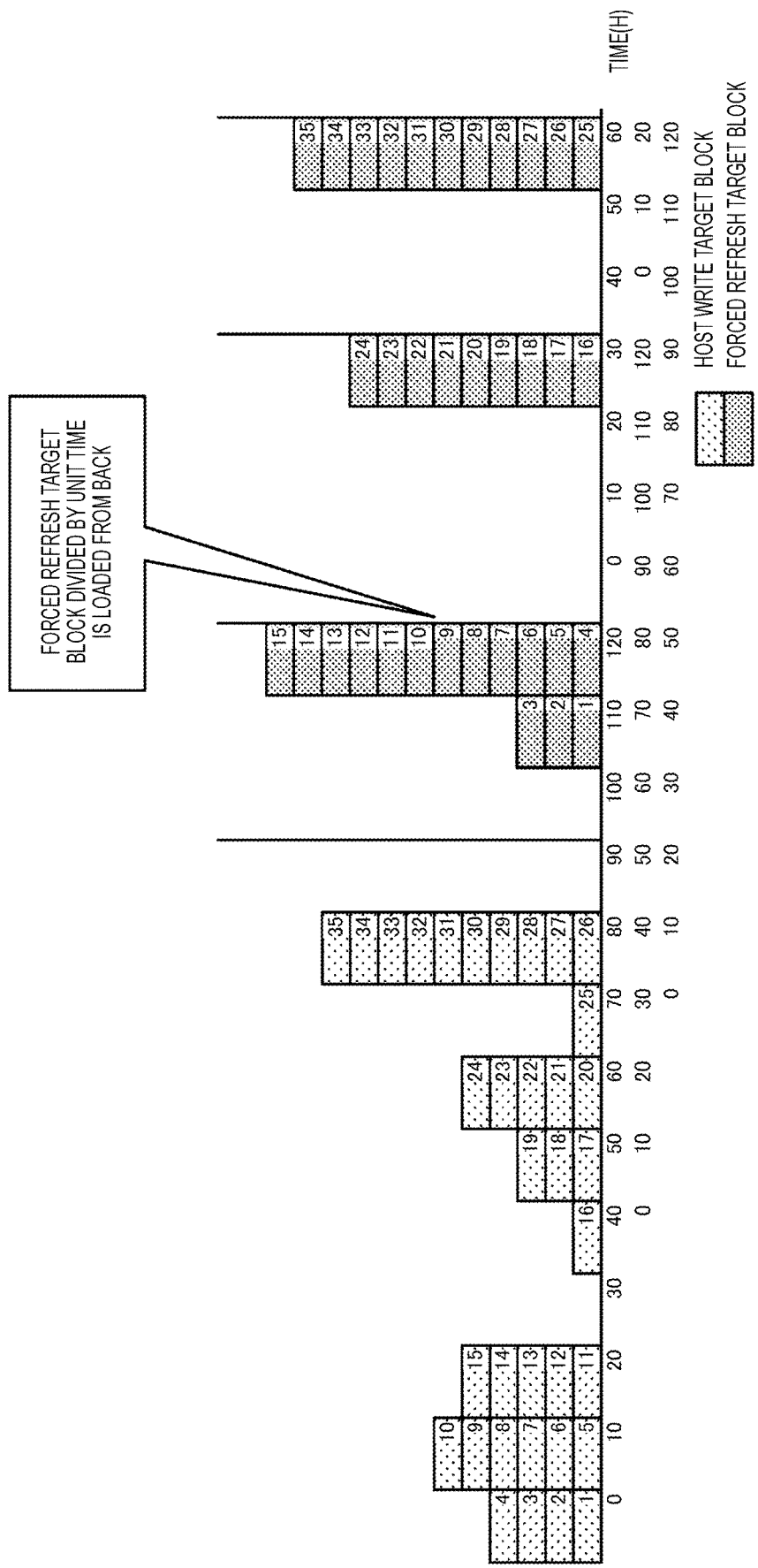
FIG. 8 is a diagram illustrating another example of a forced refresh processing in at least one embodiment.

FIG. 8 is a diagram illustrating another example of the forced refresh processing in at least one embodiment. FIG. 8 is a diagram illustrating an example of a processing that further postpones the execution of the forced refresh. The example illustrated in FIG. 8, the processing time of Worst Case is set to the unit time (30 H), all target blocks of the forced refresh are divided by the freely divided time (10 H), and the blocks are loaded from the back in each unit time. As illustrated in FIG. 8, the forced refresh for blocks 1 to 3 is executed between 100 H and 110 H, and the forced refresh for blocks 4 to 15 is executed between 110 H and 120 H. According to the example illustrated in FIG. 8 in which the loading is simply performed from the back in the cycle, there are some blocks that are not improved due to the schedule in accordance with the execution time of Worst Case, but there are more memory systems 100 that are improved.

In other words, the data access unit 32 controls such that the refresh is started for any of each block a fourth time period before the first time period from a previous writing to each block provided in the first plurality of blocks to completion of the refresh for each block, and an amount of blocks in which the refresh is started in a second half of the fourth time period is larger than an amount of blocks in which the refresh is started in a first half of the fourth time period.

For example, the data access unit 32 controls such that the refresh is started for a first number of blocks in the second half of the fourth time period, and the refresh is started for a second number of blocks other than the first number of blocks in a fifth time period before the second half of the fourth time period.

As described above, the processing time of Worst Case is used as the unit time, and the block in which the forced refresh is executed is scheduled in the unit time. Therefore, the forced refresh may not be executed unnecessarily early, and thus the acceleration of the execution cycle of the forced refresh may be reduced.

In the related art, there is a demand for alleviate such an influence on the host I/O. Therefore, in the embodiment, the following processing is performed in order to alleviate the influence on the host I/O.

Figure 9:
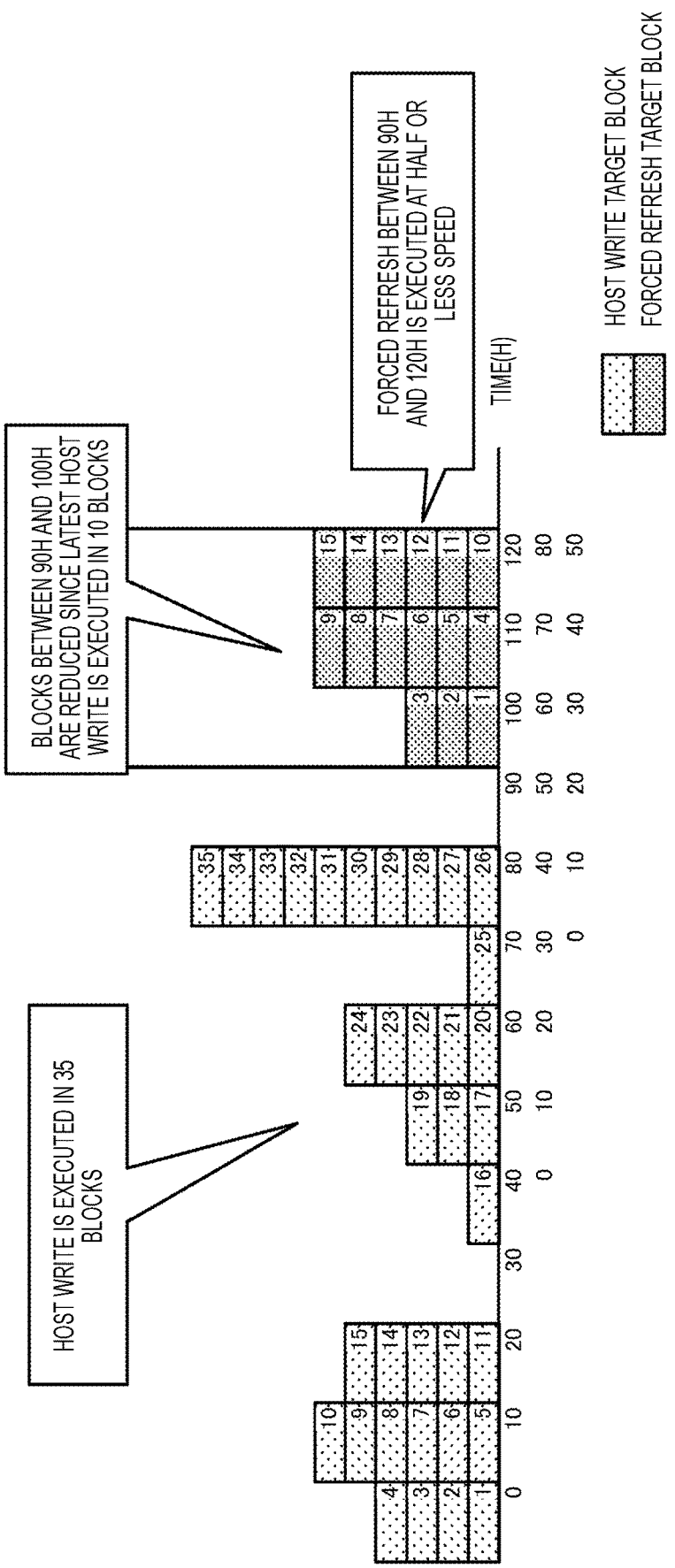
FIG. 9 is a diagram illustrating still another example of a forced refresh processing in at least one embodiment.

FIG. 9 is a diagram illustrating still another example of the forced refresh processing in at least one embodiment. FIG. 9 is a diagram illustrating an example of a processing that distributes the execution of the forced refresh. In the example illustrated in FIG. 9, it is assumed that Host Write is executed for 35 blocks.

As illustrated in FIG. 8, when the execution of the forced refresh is scheduled such that the blocks are simply loaded from the back, the influence on the host I/O may be increased.

Therefore, the data access unit 32 stores the current amount of the host I/O in the processing time of the forced refresh. Specifically, the amount of the host I/O for a freely selected time is measured at a predetermined time interval, and the measurement result is stored. In one example, the amount of the host I/O for ten hours is measured every one hour and stores ten measurement results.

Thereafter, the data access unit 32 compares the measurement result and the current amount of the host I/O to determine the speed or the start timing (start time) of the forced refresh. That is, the data access unit 32 controls the time at which the refresh is started based on the amount of the host I/O corresponding to the reading and writing of data requested by the host 200. For example, the data access unit 32 acquires the amount of the host I/O for a certain period, and when the current amount of the host I/O is larger with respect to the amount of the host I/O acquired for the certain period, delays the start timing of the execution of the forced refresh. Further, when the current amount of the host I/O is larger with respect to the amount of the host I/O acquired for the certain period, the start timing of the execution of the forced refresh is distributed to alleviate the cycle of the forced refresh. For example, when the current amount of Host Write is larger as compared to the measurement result, the data access unit 32 delays the timing at which the forced refresh is executed.

Specifically, as illustrated in FIG. 9, the data access unit 32 assumes the measurement period as 100 H, and executes the speed adjustment of the forced refresh every freely divided time (10 H). In a stage where 90 H are elapsed, the data access unit 32 determines to execute the forced refresh for 15 blocks for 30 H from that stage. Here, since Host Write is executed with respect to 35 blocks (blocks 1 to 35) in a recent 100 H, and Host Write is executed with respect to ten blocks (blocks 26 to 35) in the freely divided time (10 H) immediately before, the data access unit 32 determines that the amount of Host Write is relatively large in the current state. Then, since data movement by Host Write may be expected due to the large amount of Host Write, the data access unit 32 reduces the number of blocks which are the execution targets of the forced refresh.

That is, as illustrated in FIG. 9, in a case of Workload (processing amount) with a large amount of Host Write, the data access unit 32 reduces the number of blocks in which the forced refresh is recently executed, and passes the blocks to a later time zone. In this case, since reduction of the number of blocks which are the execution targets of the recent forced refresh may be expected by executing the refresh of data by Host Write, unnecessary wear-out may be reduced, and the influence on the host I/O may be reduced.

Specifically, as illustrated in FIG. 9, the forced refresh for blocks 1 to 3 is executed between 90 H and 100 H, the forced refresh for blocks 4 to 9 is executed between 100 H and 110 H, and the forced refresh for blocks 10 to 15 is executed between 110 H and 120 H. In the example illustrated in FIG. 9, the amount of blocks in which the forced refresh is executed between 90 H and 100 H is reduced compared to the amount of blocks in which the forced refresh is executed in the divided time after 100 H. In the example illustrated in FIG. 9, the data access unit 32 reduces one block from the number of blocks (four blocks) in which Host Write is executed in the first 10 H among Host Writes which are targets of the forced refresh, in the first divided time of the unit time. Further, the data access unit 32 uniformly processes the remaining blocks 4 to 9 and blocks 10 to 15 in the subsequent divided time in the unit time. As described above, the data access unit 32 executes the forced refresh between 90 H and 120 H at a speed of half or less of the maximum value of the number of processes per divided time. That is, the data access unit 32 controls such that, with respect to a first block and a second block provided in the first plurality of blocks, when the previous writing to the first block and the second block is executed at a same first timing, the time period from the first timing to the start of the refresh to the first block and the time period from the first timing to the start of the refresh to the second block are different from each other.

In a case of Workload (processing amount) with a small amount of Host Write, the data access unit 32 does not reduce the number of blocks in which the forced refresh is recently executed, and does not pass the number of blocks in which the forced refresh is executed in the unit time to the back. Therefore, the speed of the compaction is lowered as much as possible, and the influence on the host I/O may be reduced.

As described above, according to at least one embodiment, by provided with a mechanism capable of dynamically changing the start timing of the forced refresh and the speed of the compaction included in the forced refresh, when the schedule has a margin, the start timing is delayed so as to alleviate the acceleration of the cycle, and the influence on the host I/O may be reduced by controlling the speed of the forced refresh.

Further, according to at least one embodiment, in the case of Workload (processing amount) with a large amount of Host Write, since the refresh of data by Host Write may be expected, the blocks may be passed to a further later time zone in order to reduce the number of blocks in which the forced refresh is recently executed. Therefore, since reduction of the number of blocks which are the execution targets of the forced refresh may be expected, unnecessary wear-out may be reduced, and the influence on the host I/O may be reduced.

Further, according to at least one embodiment, in the case of Workload (processing amount) with a small amount of Host Write, since the refresh of data by Host Write may not be expected, the start timing of the forced refresh is not delayed, and the speed of the compaction included in the forced refresh is reduced as much as possible. Therefore, the influence on the host I/O may be reduced.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A memory system comprising:
   a non-volatile memory having a plurality of physical blocks; and
   a controller configured to execute a refresh for the plurality of blocks to rewrite data of a first plurality of blocks to a second plurality of blocks among the plurality of blocks,
   wherein, in a first time period from (1) a previous writing to each block provided in the first plurality of blocks to (2) completion of the refresh for each block, the controller is configured to dynamically control a starting time of the refresh for each block,
   wherein the controller is configured such that the refresh is started for any of each block in a fourth time period before the first time period, and
   wherein an amount of blocks in which the refresh is started in a second half of the fourth time period is larger than an amount of blocks in which the refresh is started in a first half of the fourth time period.

2. The memory system according to claim 1, if, with respect to a first block and a second block provided in the first plurality of blocks, a previous writing to the first block and the second block is executed at a same first timing,
   wherein the controller is configured to control such that a second time period is different from a third time period, the second time period being from the first timing to a start of the refresh to the first block, the third time period being from the first timing to a start of the refresh to the second block.

3. The memory system according to claim 1, wherein the controller is configured to control such that the refresh is started for a first number of blocks in the second half of the fourth time period, and the refresh is started for a second number of blocks, other than the first number of blocks, in a fifth time period after the second half of the fourth time period.

4. The memory system according to claim 1, wherein the controller is configured to control a time at which the refresh is started based on an amount of a host I/O corresponding to read and write of data requested by a host.

5. The memory system according to claim 4, wherein the controller is configured to:
   acquire the amount of the host I/O for a given period, and
   when a current amount of the host I/O is larger than the amount of the host I/O acquired for the given period, delay the time at which the refresh is started.

6. The memory system according to claim 1, wherein the non-volatile memory includes a NAND flash memory.

7. The memory system according to claim 1, wherein the controller is configured as a system on chip.

8. A refresh method comprising:
   executing a refresh for a plurality of blocks of a non-volatile memory provided with a plurality of physical blocks to rewrite data of a first plurality of blocks to a second plurality of blocks, the first and second plurality of blocks provided in the plurality of blocks,
   wherein, in the executing the refresh, in a first time period from (1) a previous writing to each block provided in the first plurality of blocks to (2) completion of the refresh for each block, a starting time for the refresh for each block is dynamically controlled; and
   controlling the refresh such that the refresh is started for any of each block in a fourth time period before the first time period,
   wherein an amount of blocks in which the refresh is started in a second half of the fourth time period is larger than an amount of blocks in which the refresh is started in a first half of the fourth time period.

9. The method according to claim 8, further comprising:
   if, with respect to a first block and a second block provided among the first plurality of blocks, a previous writing to the first block and the second block is executed at a same first timing, controlling the refresh such that a second time period is different from a third time period, the second time period being from the first timing to a start of the refresh to the first block, the third time period being from the first timing to a start of the refresh to the second block.

10. The method according to claim 8, further comprising:
    controlling the start of the refresh for a first number of blocks in the second half of the fourth time period, and controlling the start of the refresh for a second number of blocks, other than the first number of blocks, in a fifth time period, the fifth time period being after the second half of the fourth time period.

11. The method according to claim 8, further comprising:
controlling a time at which the refresh is started based on an amount of a host I/O corresponding to a read and write of data requested by a host.

12. The method according to claim 11, further comprising:
acquiring the amount of the host I/O for a given period, and
when a current amount of the host I/O is larger than the amount of the host I/O acquired for the given period, thereby delaying the time at which the refresh is started.

13. The method according to claim 8, wherein the non-volatile memory includes a NAND flash memory.

14. A non-transitory computer readable medium storing instructions for a refresh method, wherein when the instructions are executed by a computer, performing the refresh method comprising:
executing a refresh for a plurality of blocks of a non-volatile memory provided with a plurality of physical blocks to rewrite data of a first plurality of blocks to a second plurality of blocks provided among the plurality of blocks,
wherein, in the executing the refresh, in a first time period from (1) a previous writing to each block provided in the first plurality of blocks to (2) completion of the refresh for each block, a starting time for the refresh for each block being dynamically controlled; and
controlling the refresh such that the refresh is started for any of each block in a fourth time period before the first time period,
wherein an amount of blocks in which the refresh is started in a second half of the fourth time period is larger than an amount of blocks in which the refresh is started in a first half of the fourth time period.

15. The non-transitory computer readable medium of claim 14, wherein the instructions, when executed by the computer, are configured to perform the refresh method further comprising:
if, with respect to a first block and a second block provided among the first plurality of blocks, a previous writing to the first block and the second block is executed at a same first timing,
controlling the refresh such that a second time period is different from a third time period, the second time period being from the first timing to a start of the refresh to the first block, the third time period being from the first timing to a start of the refresh to the second block.

16. The non-transitory computer readable medium of claim 14, wherein the instructions, when executed by the computer, are configured to perform the refresh method further comprising:
controlling the start of the refresh for a first number of blocks in the second half of the fourth time period, and
controlling the start of the refresh for a second number of blocks, other than the first number of blocks, in a fifth time period, the fifth time period being after the second half of the fourth time period.

17. The non-transitory computer readable medium of claim 14, wherein the instructions, when executed by the computer, are configured to perform the refresh method further comprising:
controlling a time at which the refresh is started based on an amount of a host I/O corresponding to a read and write of data requested by a host.

18. The non-transitory computer readable medium of claim 17, wherein the instructions, when executed by the computer, are configured to perform the refresh method further comprising:
acquiring the amount of the host I/O for a given period, and
when a current amount of the host I/O is larger than the amount of the host I/O acquired for the given period, delaying the time at which the refresh is started.

19. The non-transitory computer readable medium of claim 14, wherein the non-volatile memory includes a NAND flash memory.

* * * * *